(12) United States Patent
Erbslöh et al.

(10) Patent No.: US 6,555,241 B1
(45) Date of Patent: Apr. 29, 2003

(54) CAST ALUMINUM PART HAVING A CASTING SURFACE

(75) Inventors: Hermann W. Erbslöh, Köln (DE); Franz Josef Feikus, Bonn (DE); Erich Lugscheider, Aachen (DE); Frank Löffler, Wendeburg (DE); Christian Wolff, Aachen (DE)

(73) Assignee: Vaw motor GmbH, Bonn (DE)

(*) Notice: Subject to any disclaimer, the term of this patent is extended or adjusted under 35 U.S.C. 154(b) by 0 days.

(21) Appl. No.: 09/698,216

(22) Filed: Oct. 27, 2000

Related U.S. Application Data

(62) Division of application No. 09/048,538, filed on Mar. 25, 1998, now Pat. No. 6,162,500, which is a continuation of application No. 08/883,848, filed on Jun. 27, 1997, now abandoned.

(30) Foreign Application Priority Data

Jun. 27, 1996 (DE) .......................... 196 25 577

(51) Int. Cl.⁷ ............................................... B32B 5/00
(52) U.S. Cl. ........................ 428/472; 428/469; 428/697; 428/698; 428/701
(58) Field of Search ................. 428/697, 698, 428/701, 702, 704, 457, 469, 472, 336

(56) References Cited

U.S. PATENT DOCUMENTS

| | | | |
|---|---|---|---|
| 3,540,993 A | 11/1970 | Wurm et al. | 204/298 |
| 3,900,592 A | 8/1975 | Kennedy et al. | 427/39 |
| 3,974,309 A | 8/1976 | Uy | 427/250 |
| 4,009,680 A | 3/1977 | Fengler | 118/49 |
| 4,758,451 A | * 7/1988 | van den berg et al. | 427/249 |
| 4,844,949 A | * 7/1989 | Arai et al. | 148/278 |
| 4,938,999 A | 7/1990 | Jenkin | 427/252 |
| 5,441,235 A | 8/1995 | Narasimhan et al. | 251/368 |
| 5,516,588 A | 5/1996 | van den Berg et al. | 428/469 |
| 5,587,233 A | 12/1996 | Konig et al. | 428/325 |
| 5,683,825 A | 11/1997 | Bruce et al. | 428/698 |
| 5,688,557 A | 11/1997 | Lemelson et al. | 427/249 |

FOREIGN PATENT DOCUMENTS

| | | |
|---|---|---|
| DE | 43 38 768 | 5/1995 |
| WO | WO 89/03930 | 5/1989 |

OTHER PUBLICATIONS

English Abstract for Japanese Patent Publication No. 62060863, published Mar. 17, 1987.

English Abstract for Japanese Patent Publication No. 01259157, published Oct. 16, 1989.

* cited by examiner

*Primary Examiner*—Archene Turner
(74) *Attorney, Agent, or Firm*—Darby & Darby

(57) ABSTRACT

A cylinder block of an internal combustion engine has several cylinder bores. The surfaces surrounding the cylinder bores have wear-resistant coatings which closely reproduce the surfaces. The coatings are formed by Plasma Vacuum Deposition.

18 Claims, 3 Drawing Sheets

… coating section on the first section. The first and second coating sections may form part of a single layer or, alternatively, the first coating section can constitute a base layer while the second coating section constitutes a different second layer. In either case, it is preferred for the second coating section to be formed with a hard phase.

The first coating section may be metallic and can, for example, consist of 50 atomic percent titanium and 50 atomic percent aluminum. The hard phase in the second coating section may be a nonmetallic substance.

The second coating can be formed by reacting a member of the group consisting of titanium, silicon, aluminum and chromium with an a member of the group consisting of gaseous boron, carbon, nitrogen and oxygen. The reaction is preferably carried out at a temperature of 150 to 250 degrees Centigrade.

The first and second coating sections may be produced in a gaseous atmosphere having one or more reactive components. The method can then additionally involve regulating the composition of the first coating section by controlling the concentration of at least one reactive component and/or regulating the composition of the second coating section by controlling the concentration of at least one reactive component.

The casting may have an outer peripheral wall which circumscribes the casting surface, and the method can then further comprise the step of enclosing the casting surface prior to the vapor-depositing step. It is preferred for the casting surface to be enclosed by urging a cover against the casting exclusively at the peripheral wall. If the casting is constituted by a cylinder block, the cover can be in the form of a cylinder head.

Additional features and advantages of the invention will become apparent from the following detailed description of preferred embodiments when read in conjunction with the accompanying drawings.

DESCRIPTION OF THE PREFERRED EMBODIMENTS

Figure 1:
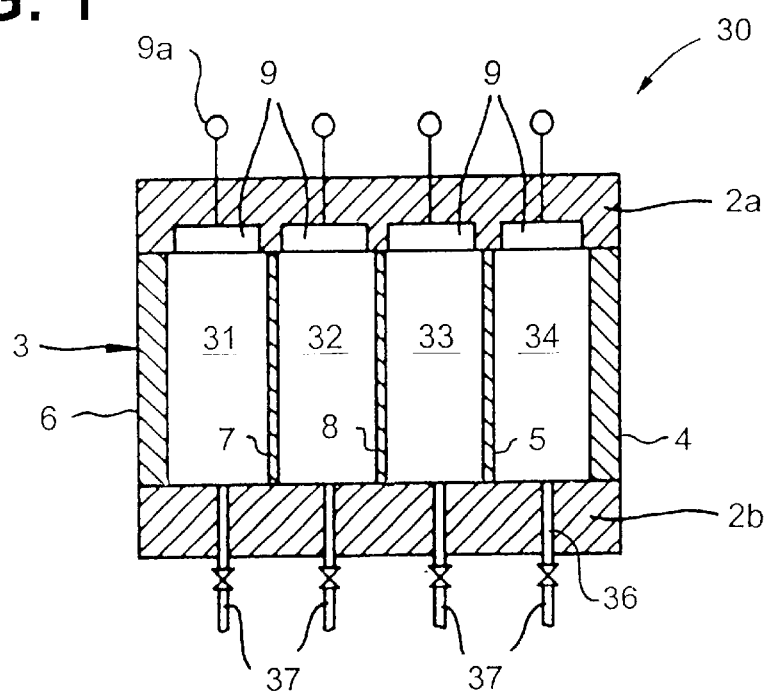
FIG. 1 is a longitudinal sectional view of an arrangement according to the invention for forming wear-resistant coatings on a casting.

According to the invention, a wear-resistant coating is formed on one or more surfaces of a casting or cast part by vapor deposition.

In a preferred embodiment, the casting is an aluminum-based cylinder block of an internal combustion engine and consists of an alloy having a composition within the following limits:

5 to 13 weight percent silicon
0.3 to 1.4 weight percent iron
less than 3.5 weight percent copper
less than 0.5 weight percent magnesium
less than 0.5 weight percent manganese
balance aluminum and residual impurities.

By way of example, the cylinder block may be composed of the alloy AlSi9Cu3. This alloy can be hardened by a solution treatment and subsequent quenching and precipitation hardening.

The cylinder block has one or more cylinder bores. In the present description, it is assumed that the cylinder block is designed for a four-cylinder engine and is provided with four cylinder bores.

Each cylinder bore is bounded by a cylinder wall, and the cylinder walls have cylindrical surfaces which face the bores and constitute internal surfaces of the cylinder block. These surfaces form running or sliding surfaces for the pistons of the engine. The internal cylindrical surfaces are honed and have the following roughness profile as measured in accordance with the German Standard DIN 4776:

$R((_k))$=0.5 to 3.0 micrometers
$R((_{nk}))$=0.1 to 2.0 micrometers
$R((_{vk}))$=0.5 to 5.0 micrometers.

Here, $R((_k))$ is the core or overall roughness, $R((_{nk}))$ the reduced peak height, and $R((_{vk}))$ the reduced groove depth.

The cylinder bores may have diameters of 30 to 150 millimeters. The cylinder bores can be arranged in a row with neighboring cylinder bores separated by a distance of 2 to 8 millimeters.

A wear-resistant coating is formed on each internal cylindrical surface. It is particularly advantageous for the coatings to be produced by Plasma Vacuum Deposition because coatings formed in this manner can reproduce the internal cylindrical surfaces, including the roughness profile of the surfaces, with a good degree of accuracy. Thus, the roughness profile of the coatings is within about 10 percent of the roughness profile of the internal cylindrical surfaces. The roughness profile of the coatings, again based on the German Standard DIN 4776, is as follows:

$R((_k))$=0.5 to 2.8 micrometers
$R((_{nk}))$=0.1 to 1.8 micrometers
$R((_{vk}))$=0.5 to 4.8 micrometers.

When forming the wear-resistant coatings using Plasma Vacuum Deposition, the cylinder block itself may consitute part of a container for confining the gases employed and the plasma generated during the process. One embodiment of an arrangement for vapor-deposition of the wear-resistant coatings includes the cylinder block, a top cover at the upper end of the cylinder block and a bottom cover at the lower end of the cylinder block. The covers abut and form vacuum-tight seals with the end surfaces of the cylinder walls thereby sealing the cylinder bores from the atmosphere. The cylinder bores then define chambers where vacuum deposition takes place on the internal cylindrical surfaces surrounding the bores.

The seals between the cylinder block and the covers can be formed in different ways. A particularly simple yet highly effective sealing system comprises cooperating, mechanically treated or machined sealing surfaces on the cylinder block and the covers. It is also possible to place sealing elements between the the cylinder block and the covers, and these sealing elements can be made of conventional heat-resistant materials.

One or more cathodes can be incorporated in the covers. The cathodes are advantageously mounted in the top cover while the bottom cover is provided with gas and vacuum connections. It is preferred for the cathodes to be bar-shaped or rod-shaped and to be movable lengthwise relative to the top cover. However, the cathodes can also be in the form of flat disks.

In another embodiment of the arrangement for vapor-deposition of the wear-resistant coatings, the bottom cover is replaced by plugs or plug-like elements which are inserted in the lower ends of the cylinder bores.

One embodiment of a method for vapor-deposition of the wear-resistant coatings involves the evacuation of air from the cylinder bores. After the cylinder bores have been evacuated, an ionizable gas is introduced into the cylinder bores. This gas is heated to a temperature of 200 to 250 degrees Centigrade. The gas is ionized, and the internal cylindrical surfaces of the cylinder block are subjected to ion etching in order to clean the surfaces. Immediately following ion etching, one or more process gases are admitted into the cylinder bores. The process gases are used to form wear-resistant coatings on the cleaned internal cylindrical surfaces of the cylinder block, and these coatings are deposited from the gas phase. The process gases are heated and may contain one or more reactive components. Preferably, vapor-deposition of the wear-resistant coatings is carried out at temperatures lower than about 250 degrees Centigrade.

The cylinder walls are generally hot during vapor-deposition and are cooled once this has been completed. Gas is fed into the cylinder bores thereby raising the pressure in the latter.

The pressure in the cylinder bores during Plasma Vacuum Deposition is typically between $10^{-4}$ and $10^{-6}$ millibar. Following vapor-deposition, the pressure can be increased to a value between $10^{-1}$ and $10^{-4}$ millibar using argon.

The Plasma Vacuum Deposition process employs one or more targets in conjunction with a gaseous atmosphere. The gaseous atmosphere has a subatmospheric pressure and includes an inert gas. In an arrangement according to the invention, the cathodes serve as targets while the cylinder block functions as an anode. For Plasma Vacuum Deposition, a large potential difference is created between the cathodes and the cylinder block by applying a high negative voltage to the cathodes and a positive voltage to the cylinder block. Inert gas present between the cathodes and the cylinder block is ionized to produce a high-energy plasma containing positive gas ions. These ions are attracted to the negatively charged cathodes and impinge upon the same with energies of several KeV. When the positive gas ions impact the cathodes, energy is transferred from the ions to the cathodes. This energy suffices to knock individual atoms out of the cathodes, and such atoms go from the solid state to the gaseous state without passing through the liquid state.

Due to the voltage applied to the cylinder block, the liberated atoms are deposited thereon. An arrangement in accordance with the invention is designed so that the atoms deposit on the internal cylindrical surfaces surrounding the cylinder bores, and coatings are produced on these surfaces by the deposited atoms. The growth conditions for the coatings can be improved by heating the cylinder block during vapor-deposition.

The coatings preferably have thicknesses of 0.5 to 20 microns. With a method and an arrangement according to the invention, the thickness of the coatings lengthwise of the cylinder bores, i.e., along the direction of movement of the pistons, as well as circumferentially of the cylinder bores, can vary by as little as ±10 percent. This is a remarkably small variation for coating thicknesses of 0.5 to 20 microns.

As mentioned previously, the cathodes may be bar-shaped or rod-shaped and can be mounted in one of the cylinder block covers for movement lengthwise relative to the cover. Uniform coating thicknesses as above can be obtained by using such a construction and arranging each cathode so that the longitudinal axis thereof coincides with the longitudinal axis of one of the cylinder bores. The cathodes are then displaceable along the longitudinal axes of the cylinder bores.

For the high-energy atomization of the cathodes, one or more permanent magnets can be disposed above the same. When the cathodes are bar-shaped or rod-shaped, the permanent magnets are situated so that the field lines of their magnetic fields and planes containing the longitudinal axes of the cathodes intersect at right angles. On the other hand, if the cathodes are designed as flat sheets or plates, the permanent magnets are arranged in such a manner that the planes defined by the cathodes form right-angled intersections with the field lines. Due to the interactions of the electric fields of the cathodes and the magnetic fields of the permanent magnets, a Lorentz force acts on the electrons in the plasma and causes the electrons to move along elongated spiral paths. As a result, the distance traveled by the electrons between collisions with other particles decreases so that the probability of ionization, and hence the number of inert gas ions, increases.

The wear-resistant coatings may comprise one or more refractory metals from Groups IV to VI of the Periodic Table, or mixtures or compounds including these metals. Preferably, the proportion of metal atoms in the coatings is greater than 30 atomic percent.

It is particularly advantageous for the wear-resistant coatings to include aluminum and/or silicon, and especially mixtures or compounds containing the same. Such coatings have a uniformity and density which fulfill the requirements for engine construction exceedingly well.

The wear-resistant coatings may further comprise one or more of the elements boron, nitrogen, oxygen and carbon. These elements, which can combine with other substances to form hard phases, allow the coatings to reproduce the honed structures of the internal cylindrical surfaces with a particularly high degree of precision. When using boron, nitrogen, oxygen and/or carbon, the roughness of the coatings may deviate from the roughness of the internal cylindrical surfaces by as little as 0.1 micrometer.

The wear-resistant coatings contain one or more hard phases which impart wear resistance to the coatings and are constituted by nonmetallic compounds. The wear-resistance to the coatings have exposed surfaces or wearing surfaces on which the pistons ride, and the exposed surfaces should exhibit a particularly high wear resistance since they are subjected to the action of the pistons. To this end, it is preferred for the hard phase content at the exposed surfaces to be greater than about 80 atomic percent. The hard phase content of the wear-resistant coatings can be regulated by controlling the proportion of the reactive component or components in the process gas employed for Plasma Vacuum Deposition. The average hard phase content of the wear-resistant coatings is advantageously 50 atomic percent or less with 50 atomic percent being optimal under certain circumstances.

The wear-resistant coatings contain one or more hard phases which impart wear resistance to the coatings and are usually constituted by nonmetallic compounds. The wear-resistant coatings have exposed surfaces or wearing surfaces on which the pistons ride, and the exposed surfaces should exhibit a particularly high wear resistance since they are subjected to the action of the pistons. To this end, it is preferred for the hard phase content at the exposed surfaces to be greater than about 80 atomic percent. The hard phase content of the wear-resistant coatings can be regulated by controlling the proportion of the reactive component or components in the process gas employed for Plasma Vacuum Deposition. The average hard phase content of the wear-resistant coatings is advantageously 50 atomic percent or less with 50 atomic percent being optimal under certain circumstances.

Each wear-resistant coating may include a base section which contacts the respective internal cylindrical surface and one or more additional sections on the base section. The base sections can serve as a bonding sections which serve to tightly bind the wear-resistant coatings to the internal cylindrical surfaces. The different coating sections may be in the form of different layers or may constitute different parts of a single layer having areas of different composition and/or structure. Such a single layer can exhibit compositional and/or structural gradients. Coatings consisting of a single layer having areas of different composition and/or structure, as well as multilayered coatings, can be produced by varying the proportion of the reactive components in the process gas used for Plasma Vacuum Deposition.

The properties in a multilayered wear-resistant coating change stepwise from layer to layer. On the other hand, in a wear-resistant coating consisting of a single layer with compositional and/or structural gradients, the properties change progressively so that there can be a continuous adjustment to the stress conditions which arise. In this regard, the ratio of nonmetallic compounds to metal is of significance. The term "wear-resistant coating" or "hard coating" encompasses a combination of nonmetallic compounds and metal whose composition can be changed steplessly from 100 percent metal to a lower percentage thereof by varying the proportion of the reactive components in the process gas employed for Plasma Vacuum Deposition.

One embodiment of the wear-resistant coatings comprises a base section having a metal content greater than 90 atomic percent, and one additional section having a hard phase content which increases from the base section to the exposed surface of the coating and may reach a value of 100 atomic percent. The base section here serves as a metallic bonding section. Wear-resistant coatings of this type have remarkably good bonding characteristics and resistance to breakage. Furthermore, the compositional and/or structural gradients within such coatings make it possible, for example, to have a transition section within the coatings or to reduce stresses in the coatings.

Another embodiment of the wear-resistant coatings includes a base section of titanium aluminum carbonitride, and one or more additional sections with a hard phase or hard phases containing oxygen and/or nitrogen. The hard phase content increases in a direction away from the base section so that there is a compositional and/or structural gradient which allows the base section to function as a transition section between the internal cylindrical surfaces of the cylinder block and the additional sections. The base section in the wear-resistant coatings of this embodiment has particularly good damping characteristics and also possesses some ductility which enables the base section to absorb stresses.

The cylinder block, which is made of a relatively soft aluminum-based substance, is provided with hard protective wear-resistant coatings. Such a combination of soft and hard substances is susceptible to the formation of fatigue cracks, and it is thus of advantage for the wear-resistant coatings to comprise a transition section which is able to inhibit cracks of this type. In the previous embodiment, the base section, which serves as a transition section, contains hardening elements which cause the base section to develop internal stresses capable of inhibiting fatigue cracks.

A further embodiment of the wear-resistant coatings includes a base section with 50 atomic percent titanium and 50 atomic percent aluminum, and an additional section containing CrAl and/or at least one compound, e.g., SiC, obtained by reacting one or more of the elements titanium, silicon, aluminum and chromium with one or more of the elements boron, carbon, nitrogen and oxygen. The reaction is preferably carried out at a temperature of 150 to 250 degrees Centigrade. The boron or carbon, if used, is advantageously in the gaseous state. The base section, which functions as a bonding section in the wear-resistant coatings of the present embodiment, can have a particularly small thickness.

The ternary compositions titanium-aluminum-nitrogen and chromium-aluminum-nitrogen have been found to be especially wear-resistant with titanium-aluminum-nitrogen exhibiting an exceedingly high hardness. Wear-resistant coatings containing chromium-aluminum-nitrogen can provide corrosion protection in addition to wear resistance.

Referring to FIG. 1, the numeral 30 identifies an arrangement in accordance with the invention for vapor-depositing wear-resistant coatings on the cylinder block which is denoted by 3 and forms part of the arrangement. The cylinder block 3 which, as indicated previously, is designed for a four-cylinder engine, has four cylinder bores 31, 32, 33 and 34 of circular cross section. The cylinder bores 31,32, 33,34 are bounded by cylinder walls, and sections of the cylinder walls are shown at 4, 5, 6, 7 and 8. The cylinder block 3 has an outer peripheral wall which circumscribes the cylinder bores 31,32,33,34, and the cylinder wall sections 4,6 constitute part of the outer peripheral wall. The cylinder block walls have cylindrical surfaces which face and surround the cylinder bores 31,32,33,34, and these surfaces constitute internal surfaces of the cylinder block 3. The internal cylindrical surfaces serve as running or sliding surfaces on which the pistons ride.

The cylinder block 3 is oriented upright in FIG. 1 so that the cylinder bores 31,32,33,34, as well as the cylinder block walls, are generally vertical. The upper ends of the cylinder bores 31,32,33,34 are open, and a flat top cover 2a sits on the upper end surfaces of the cylinder block walls and closes the cylinder bores 31,32,33,34 from above. The lower ends of the cylinder bores 31,32,33,34 are also open, and a flat bottom cover 2b sits against the lower end surfaces of the cylinder block walls and closes the cylinder bores 31,32,33, 34 from below. The covers 2a,2b are held on and urged against the cylinder block walls by biasing elements 35.

The end surfaces of the cylinder block walls are mechanically treated or machined in such a manner that they can function as sealing surfaces. The surfaces of the covers 2a,2b which abut the end surfaces of the cylinder block walls are mechanically treated or machined in the same way. These surfaces of the covers 2a,2b cooperate with the end surfaces of the cylinder block walls to form vacuum-tight seals. Thus, when the biasing elements 35 urge the covers 2a,2b against the end surfaces of the cylinder block walls, each of the cylinder bores 31,32,33,34 becomes a vacuum chamber.

Instead of mechanically treating or machining the end surfaces of the cylinder block walls and the abutting surfaces of the covers 2a,2b so that they can serve as sealing surfaces, sealing elements can be interposed between the covers 2a,2b and the cylinder block walls.

Four electrodes 9, which function as cathodes during vapor-deposition and will be referred to as cathodes, are mounted on the top cover 2a. Each of the cathodes 9 faces one of the cylinder bores 31,32,33,34. The cathodes 9, which are in the form of flat disks, are connected to electrical terminals 9a. The cathodes 9 are here fixed on the top cover 2a but could also be movable up-and-down relative thereto.

The outer peripheral wall of the cylinder block 3 is connected to an electrical terminal 20. This allows the cylinder block 3 to act as an electrode.

The bottom cover 2b is provided with four passages 36. Each of the passages 36 opens to one of the cylinder bores 31,32,33,34 at a first end of the respective passage 36. A gas and vacuum connection 37 is mounted at the other end of each passage 36.

Figure 2:
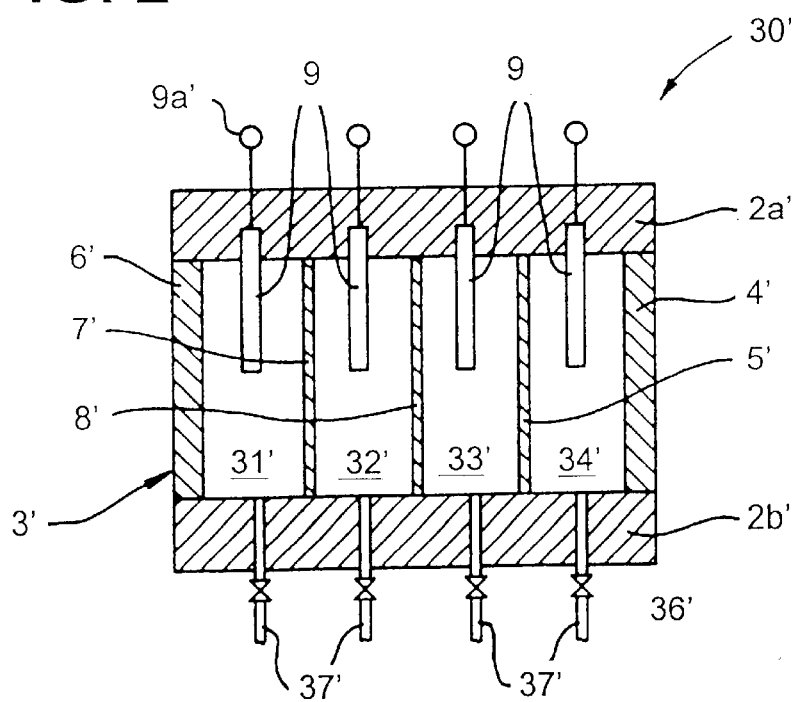
FIG. 2 is a longitudinal sectional view of another arrangement in accordance with the invention for forming wear-resistant coatings on a casting.

In FIG. 2, the same reference numerals as in FIG. 1, but with primes, are used to identify similar elements.

The arrangement 30' of FIG. 2 differs from the arrangement 30 of FIG. 1 in that the cathodes 9' are bar-shaped or rod-shaped rather than disk-shaped. The cathodes 9' are movable up-and-down on the top cover 2a'.

The arrangements 30 and 30' can be used for Plasma Vacuum Deposition of wear-resistant coatings on the internal cylindrical surfaces of the cylinder blocks 3 and 3'. Prior to the start of the Plasma Vacuum Deposition process, air is evacuated from the cylinder bores 31,32,33,34 or 31',32', 33',34' via the gas and vacuum connections 10 or 10'. Following evacuation, an ionizable gas is admitted into the cylinder bores 31,32,33,34 or 31',32',33',34' by way of the connections 10 or 10'. The gas is ionized, and the internal cylindrical surfaces of the cylinder block 3 or 3' are thereupon cleaned by ion etching the internal cylindrical surfaces. As soon as ion etching has been completed, wear-resistant coatings are formed on the internal cylindrical surfaces using Plasma Vacuum Deposition.

Turning to FIGS. 3–6, the same reference numerals as in FIG. 1, but with double primes, are used to denote similar elements.

Unlike the top covers 2a and 2a' of FIGS. 1 and 2, the top cover 2a" of FIGS. 3–6 is not flat but resembles an upside-down box. Thus, the top cover 2a" has an end wall 38, and sidewalls 39 projecting downward from the end wall 38 to the cylinder block 3". The sidewalls 39 rest on the outer peripheral wall of the cylinder block 3", and the top cover 2a" contacts only this peripheral wall. The top cover 2a" defines a compartment 13 which is located above and extends across the cylinder bores 31",32",33",34". The compartment 13 and the cylinder bores 31",32",33",34" together form a vacuum chamber. The top cover 2a" can, for example, be constituted by a cylinder head.

The sidewalls 39 are provided with passages 40. Each of the passages 40 opens to the compartment 13 at a first end of the respective passage 40. A gas and vacuum connection 15 is mounted at the other end of each passage 40.

In FIGS. 3–6, the bottom covers 2b and 2b' of FIGS. 1 and 2 are eliminated. Instead, a cylindrical plug 2 is inserted in the lower end of the cylinder bore 31", a cylindrical plug 10 in the lower end of the cylinder bore 32', a cylindrical plug 11 in the lower end of the cylinder 33", and a cylindrical plug 12 in the lower end of the cylinder bore 34". The plugs 2,10,11,12 are designed to form vacuum-tight seals with the internal cylindrical surfaces surrounding the cylinder bores 31",32",33",34".

Figure 3:
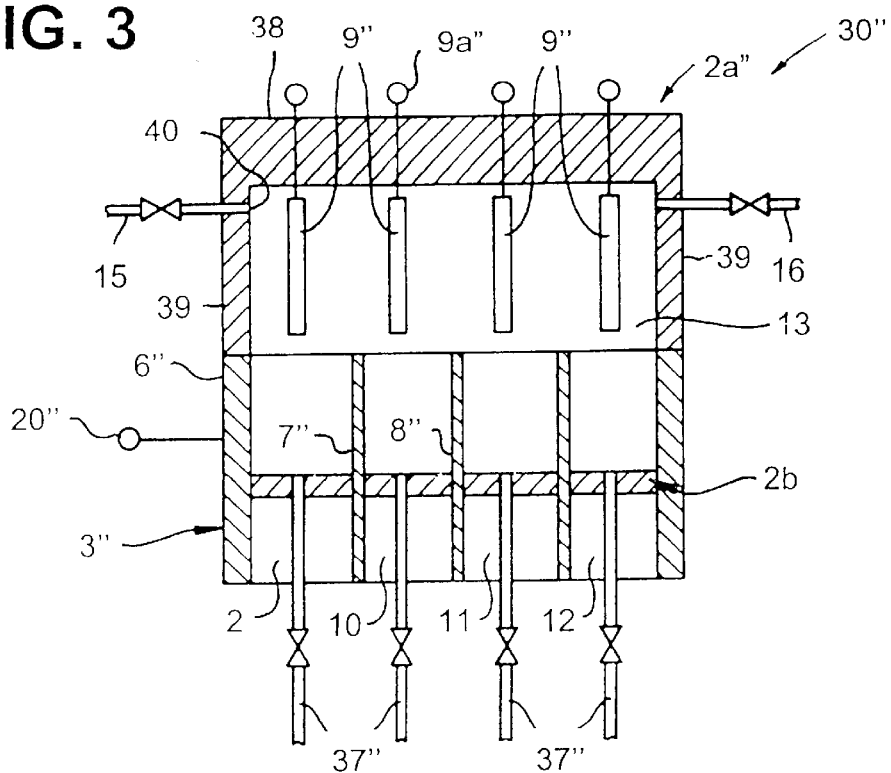
FIG. 3 is a longitudinal sectional view of an additional arrangement in accordance with the invention for forming wear-resistant coatings on a casting, the arrangement being shown during a preliminary stage of a coating process.

The operation of the arrangement of FIGS. 3–6 is as follows:

In FIG. 3, the cathodes 9" are in a raised position.

Air is evacuated from the compartment 13 and the cylinder bores 31",32",33",34" 13 by way of the gas and vacuum connections 15,37". An ionizable gas is then admitted into the compartment 13 and the cylinder bores 31",32", 33",34" through the connections 15,37".

Figure 4:
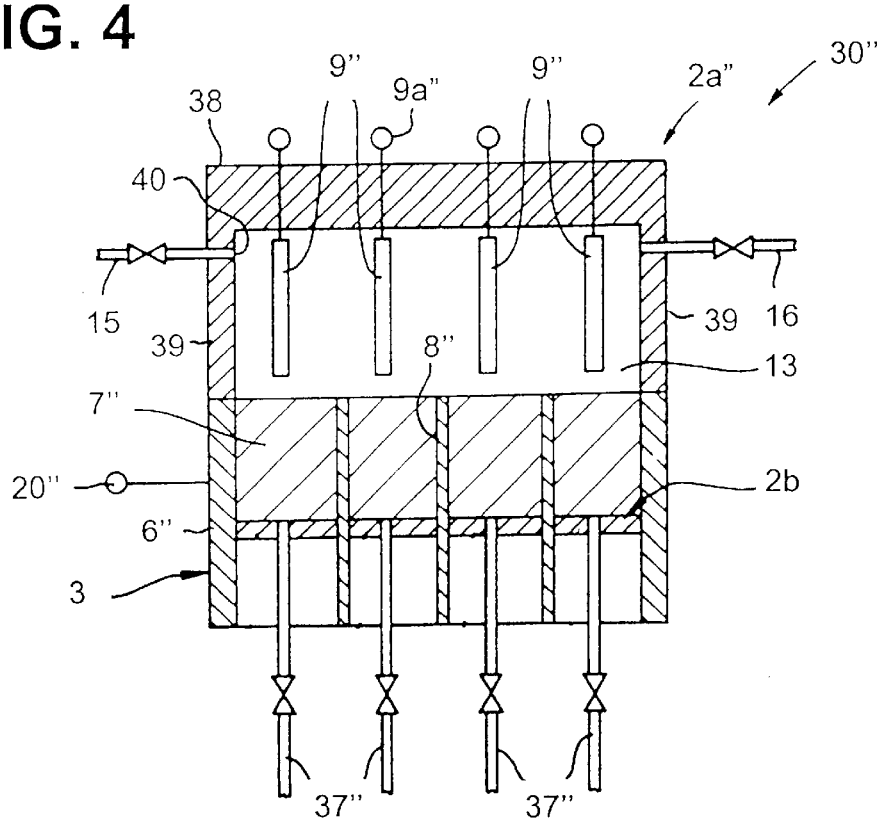
FIG. 4 is similar to FIG. 3 but illustrates the arrangement during a subsequent stage of the coating process.

The cathodes 9" remain in the raised position in FIG. 4 where voltage is applied to the terminals 9a" and 20" in such a manner that the cathodes 9" temporarily become anodic while the cylinder block 3" becomes cathodic. The ionizable gas is ionized, and the internal cylindrical surfaces around the cylinder bores 31",32",33",34" undergo ion etching to clean the same. Impurities are sucked out of the compartment 13 and the cylinder bores 31",32",33",34" via the gas and vacuum connections 15,37".

Figure 5:
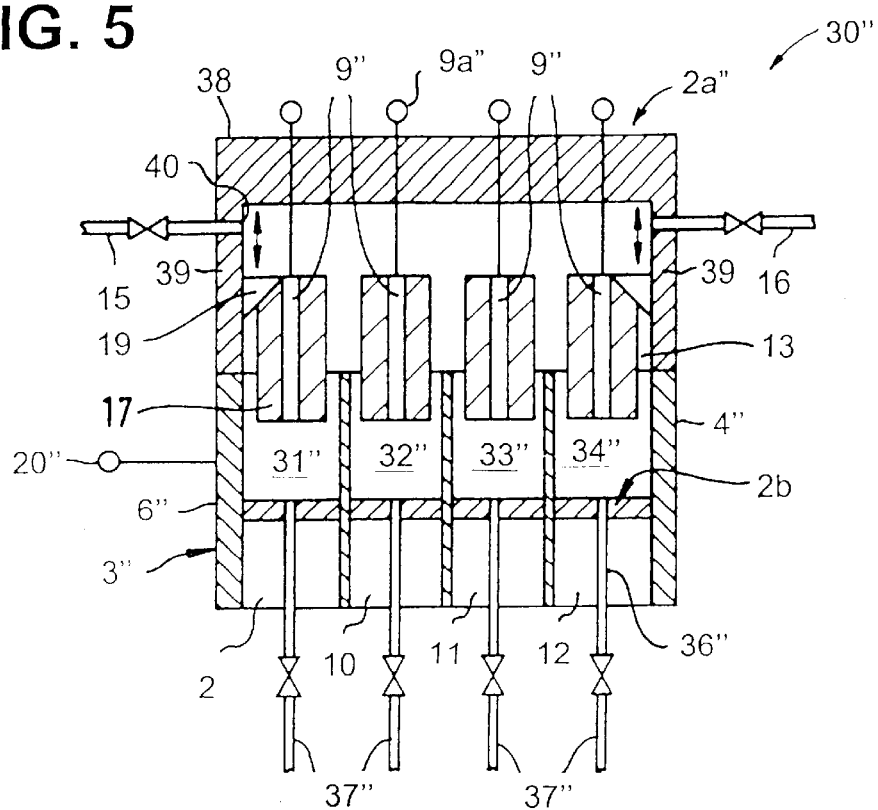
FIG. 5 is similar to FIG. 4 but shows the arrangement during a later stage of the coating process.

Once the internal cylindrical surfaces have been cleaned, hot process gas containing one or more reactive components is admitted into the compartment 13 and the cylinder bores 31",32",33",34" by way of the gas and vacuum connections 15,37". The polarities of the cathodes 9" and cylinder block 3" are reversed so that the cathodes 9" become cathodic and the cylinder block 3" becomes anodic. The cathodes 9" are moved downward to a lowered position by moving or shifting devices 19 as illustrated in FIG. 5. In the lowered position, the cathodes 9" extend into the cylinder bores 31",32",33",34". A vacuum is maintained in the compartment 13 and the cylinder bores 31",32",33",34" through the gas and vacuum connections 15,37".

The voltage applied to the cathodes 9" and the cylinder block 3" is made sufficiently large to support the existence of a plasma between the cathodes 9" and the internal cylindrical surfaces around the cylinder bores 31",32",33", 34". With the cathodes 9" serving as targets, wear-resistant coatings are now formed on the internal cylindrical surfaces by Plasma Vacuum Deposition. The Plasma Vacuum Deposition process is carried out immediately after cleaning of the internal cylindrical surfaces has been completed.

By varying the composition of the process gas, the wear-resistant coatings can be made multilayered or in the form of a single layer with compositional and/or structural gradients.

Figure 6:
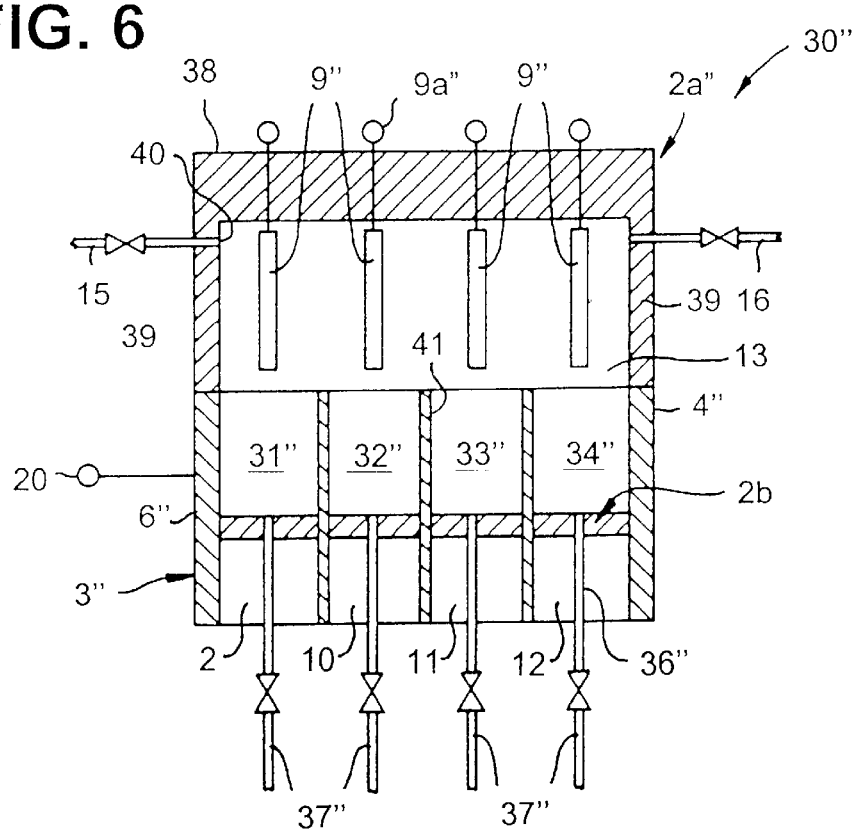
FIG. 6 is similar to FIG. 5 but illustrates the arrangement during a following stage of the process.

Following Plasma Vacuum Deposition, the voltage to the cathodes 9" and the cylinder block 3" is shut off. The cathodes 9" are moved to their raised position as shown in FIG. 6 where the wear-resistant coatings are denoted by 41. A cooling gas can be fed into the compartment 13 and the cylinder bores 31",32",33",34" via the gas and vacuum connections 15,37".

An arrangement per invention can be readily modified to minimize vacuum chamber size.

In an arrangement according to the invention, the cylinder walls of a cylinder block constitute part of a vessel for Plasma Vacuum Deposition. This enables exceedingly small vacuum chambers, which can be readily sealed, to be obtained. Moreover, the surfaces of the cylinder block which are subjected to vacuum and cleaning can be restricted to the surfaces which are to be coated. Unnecessary cleaning of surfaces which are not to be coated can thus be avoided.

Various modifications are possible within the meaning and range of equivalence of the appended claims.

What is claimed is:

1. An aluminum casting, comprising:
    a machined internal cylindrical casting surface having a core roughness of approximately 0.5 micrometers to approximately 3.0 micrometers, a reduced peak height of approximately 0.1 micrometers to approximately 2.0 micrometers, and a reduced groove depth of approximately 0.5 micrometers to approximately 5.0 micrometers; and
    a vapor deposited wear resistant coating on said casting surface, said coating having a core roughness of approximately 0.5 micrometers to approximately 2.8 micrometers, a reduced peak height of approximately 0.1 micrometers to approximately 1.8 micrometers, and a reduced groove depth of approximately 0.5 micrometers to approximately 4.8 micrometers.

2. The casting of claim 1, wherein said coating comprises a refractory metal from Groups IV to VI of the Periodic Table.

3. The casting of claim 1, wherein said coating comprises a hard phase selected from the group consisting of aluminum and silicon.

4. The casting of claim 1, wherein said coating comprises a hard phase selected from the group consisting of boron, nitrogen, oxygen and carbon.

5. The casting of claim 1, wherein said coating is provided with a wearing surface having a hard phase content greater than approximately 80 atomic percent.

6. The casting of claim 1, wherein said coating has a thickness of approximately 0.5 micrometers to approximately 20 micrometers.

7. The casting of claim 1, wherein said coating comprises a base layer on said casting surface, and a second layer on said base layer, said second layer containing a hard phase.

8. The casting of claim 1, wherein said coating comprises a first section on said casting surface and a second section on said first section, said first section being metallic, and said second section having a hard phase content which increases in a direction away from said first section.

9. The casting of claim 1, wherein said coating comprises a first section on said casting surface and a second section on said first section, each of said sections including at least one carbonitride, and the carbonitride content in said second section increasing in a direction away from said first section.

10. The casting of claim 9, wherein said first section comprises titanium aluminum carbonitride.

11. The casting of claim 9, wherein the percentage of carbonitride in said second section is less than or equal to approximately 50 atomic percent.

12. The casting of claim 1, wherein said coating comprises a first section on said casting surface and a second section on said first section, said first section having a metal content greater than or equal to approximately 90 atomic percent, and said second section having a hard phase content which increases in a direction away from said first section to a maximum of approximately 100 percent.

13. The casting of claim 1, wherein said casting comprises approximately 5 to approximately 13 percent by weight silicon, approximately 0.3 to approximately 1.4 percent by weight iron, less than approximately 3.5 percent by weight copper, less than approximately 0.5 percent by weight magnesium and less than approximately 0.5 percent by weight manganese with the balance being aluminum and residual impurities, said coating including a member selected from the group consisting of nitride-forming and carbide-forming refractory metals from Groups IV to VI of the Periodic Table.

14. The casting of claim 1, wherein said casting is a cylinder block.

15. The casting of claim 14, wherein said cylinder block has a plurality of bores defined therein and said casting surface at least partially bounds one of said bores, said bores having a diameter between approximately 30 millimeter to approximately 150 millimeters, and neighboring bores are spaced apart from one another by a distance between approximately 2 millimeters to approximately 8 millimeters.

16. The casting of claim 1, wherein the thickness of said coating varies by approximately ±10 percent.

17. The casting of claim 1, wherein said coating is non-uniform so as to allow formation of lubricant reservoirs and pockets.

18. The casting of claim 1, wherein said casting is vapor-deposited at a temperature less than approximately 250 degrees Centigrade on said casting surface using an electrode shaped as one of a bar and a rod.

* * * * *